United States Patent
Du et al.

(10) Patent No.: US 7,206,711 B2
(45) Date of Patent: Apr. 17, 2007

(54) SYSTEM AND METHOD FOR AUTOMATICALLY COMPARING TEST POINTS OF A PCB

(75) Inventors: Xiao-Yu Du, Shen-Zhen (CN); Mo-Ying Tong, Shen-Zhen (CN)

(73) Assignees: Hong Fu Jin Precision Industry (Shenzhen) Co., Ltd., Shenzhen, Guangdong Province (CN); Hon Hai Precision Indusrty Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 11/141,068

(22) Filed: May 31, 2005

(65) Prior Publication Data

US 2005/0270017 A1   Dec. 8, 2005

(30) Foreign Application Priority Data

Jun. 4, 2004   (TW)   ............................... 93116214 A

(51) Int. Cl.
   *G06F 19/00*   (2006.01)
(52) U.S. Cl. .................. 702/117; 702/118; 702/119; 702/120; 702/121; 702/122; 702/123; 716/4; 716/5
(58) Field of Classification Search ............... 702/117, 702/118–123; 707/101; 716/4–5
   See application file for complete search history.

(56) References Cited

U.S. PATENT DOCUMENTS

| 5,485,081 A | 1/1996 | Whitehead et al. ...... 324/158.1 |
| 2004/0068512 A1* | 4/2004 | Liu et al. ..................... 707/101 |

* cited by examiner

*Primary Examiner*—Marc S. Hoff
*Assistant Examiner*—Phuong Huynh
(74) *Attorney, Agent, or Firm*—Morris Manning & Martin LLP; Tim Tingkang Xia, Esq.

(57) ABSTRACT

A system for automatically comparing test points of a PCB includes an application server (1) and a database (6). The application server includes: a PCB file selecting module (10) for selecting a target file and a source file from the database; a test point data extracting module (12) for extracting test point data from the target file and the source file; a table generating module (14) for generating a target table according to the extracted test point data from the target file and generating a source table according to the extracted test point data from the source file; a comparing module (16) for comparing the test point data of the target table and the source table one by one and storing comparison results on those test points which have been modified; and a report generating module (18) for generating a comparison report. A related method is also disclosed.

6 Claims, 4 Drawing Sheets

| SN | Network Trace Name | Status | TP Number | Location | Pad Name | Pad Type | TP Layer |
|---|---|---|---|---|---|---|---|
| 1 | +12v | Added | 1/0 | (-100.0 -8545.0) | S42D30 | Pin | Etch/Bottom |
| 2 | +5v | Shifted | 1/1 | (-8345.0 -1310.01) | C56D40 | Pin | Etch/Bottom |
|   |   |   |   | (705.0 8395.0) | Testc24p14c26 | Via | Etch/Bottom |
| 3 | -12v | Removed | 0/1 | (1200.0 8120.0) | C52D36 | Pin | Etch/Bottom |

FIG. 4

SYSTEM AND METHOD FOR AUTOMATICALLY COMPARING TEST POINTS OF A PCB

BACKGROUND OF THE INVENTION

1. Field of the Invention

The present invention pertains to systems and methods for testing printed circuit boards, and more particularly to a system and method for automatically comparing test points of a printed circuit board.

2. General Background

Generally, a Printed Circuit Board (PCB) is capable of printing a certain circuit on a substrate formed of a paper phenol or glass epoxy after coating a thin copper film thereon and removing the non-printed portion of the substrate based on an etching technique. Electrical parts such as IC are mounted on the surface of the substrate by a PCB welding method.

Recently, the PCB has become light and small-sized for mounting a highly integrated part thereon based on an advanced technique, and is a basic element for increasing the integrity of the electrical parts. Therefore, the importance of the same attracts a big attention. The pattern of the recently fabricated PCB becomes intensive based on the increased integrity, so that a more intensive pattern printing process is needed, and an error possibility is increased. It is recognized that a defect test of the PCB is important.

The defect test of the PCB is implemented by applying an electrical signal to a certain contact point of the PCB which is a tested object for thereby checking an electrical connection state of the contact point of the PCB. Namely, the test of the PCB is performed using a PCB test device. The PCB test device typically includes a test pin unit having a test pin capable of contacting a certain contact point of the PCB and applying an electrical signal to the contact point, and a test pin feeding device capable of feeding the test unit in a 2-axis direction with respect to the PCB. The test unit is fed to a certain place of the PCB based on a 2-axis direction movement using the feeding device and applies an electrical signal to a certain contact point which is judged to be tested using the test pin for thereby checking an electrical connection state, so that it is possible to check a defect state of the PCB.

Testing certain points of a PCB during the design course is much important, since most of possible errors can be avoided in this stage. Usually, there are various versions generated in different phases of designing the PCB. The machine structure and hardware frames of the versions are always the same, and the slight difference may exist in network traces, function modules, and locations of the test points. However, in the conventional methods for testing such PCBs, engineers need to adjust or reprogram the test devices, so test efficiency is very slow.

Therefore, what is needed is a system and method for automatically comparing test points of a PCB in different design versions, which can generate a comparison report according to comparison results in order that engineers can adjust slightly the test devices according to the comparison report.

SUMMARY

A system for automatically comparing test points of a PCB in accordance with a preferred embodiment of the present invention includes an application server, a database connected to the application server through a connection, and a plurality of client computers linked to the application server. The database stores a plurality of PCB files. The PCB files may be design drawings of a PCB in different versions. The application server is used for comparing test points in a target file and a corresponding source file, and generating a comparison report. The target file is generally the newest version of design drawings of a PCB. The source file may be a former version of the target file. The application server 1 includes a PCB file selecting module, a test point data extracting module, a table generating module, a comparing module, and a report generating module. The PCB file selecting module is for selecting a target file and a corresponding source file in which test points are to be compared. The test point data extracting module is for extracting test point data from the target file and the source file. The table generating module is for generating a target table according to the extracted test point data from the target file, and generating a source table according to the extracted test point data from the source file. The comparing module is for comparing the test point data in the target table and the source table one by one to check whether each of the test points is modified, and storing comparison results on those test points which have been modified. The report generating module is for generating a comparison report according to the comparison results of the test points.

Further, a preferred method for automatically comparing test points of a PCB is also provided. The method includes the steps of: selecting a target file and a corresponding source file from a database; extracting test point data from the target file and the source file respectively; generating a target table and a source table respectively according to the extracted test point data from the target file and the source file; comparing the test point data in the target table with the test point data in the source table, and storing comparison results on those test points which have been modified; and generating a comparison report according to the comparison results.

Other advantages and novel features of the present invention will be drawn from the following detailed description of a preferred embodiment and preferred method with the attached drawings, in which:

BRIEF DESCRIPTION OF THE DRAWINGS

FIG. 4 is a schematic diagram showing details of a comparison report.

DETAILED DESCRIPTION OF THE PREFERRED EMBODIMENTS

Figure 1:
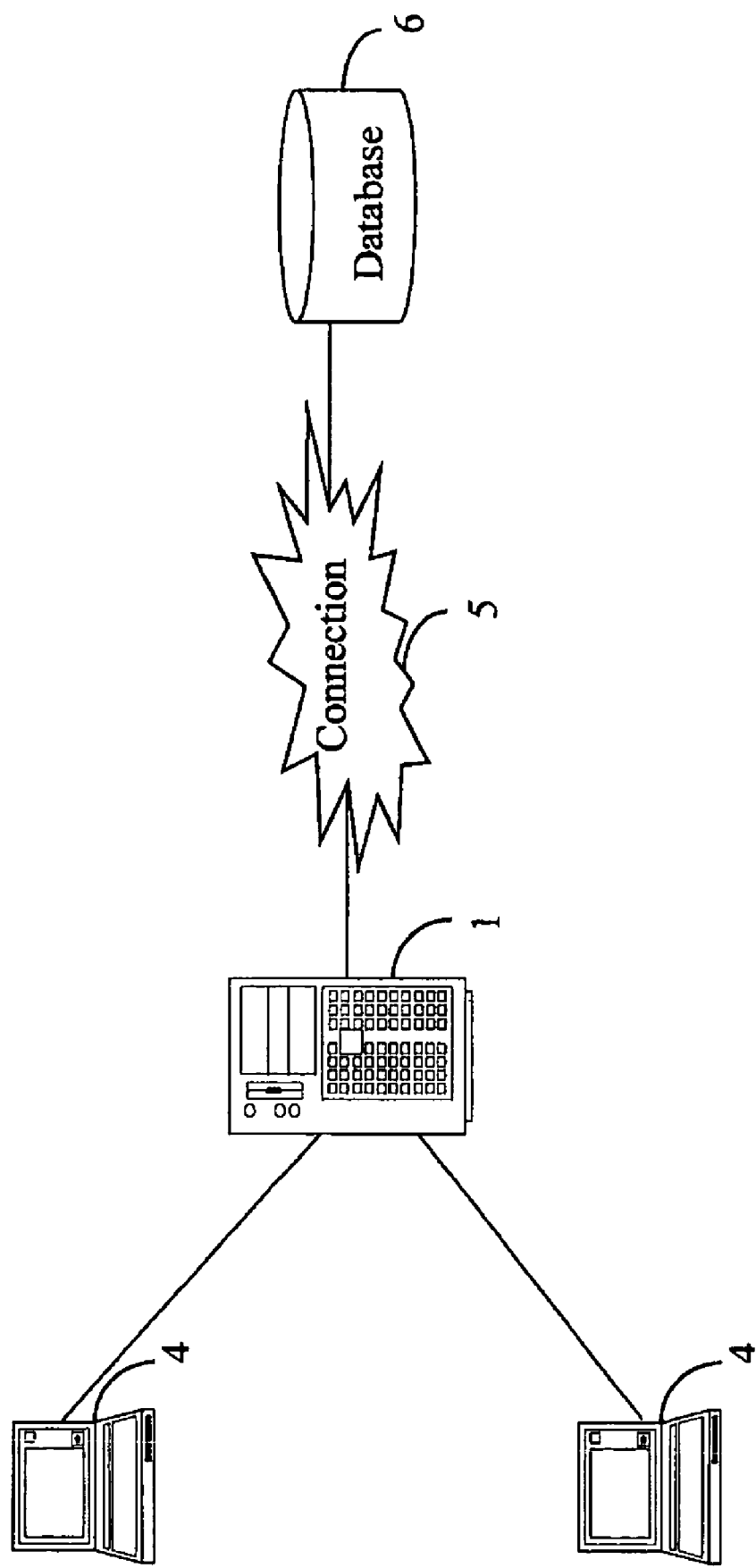
FIG. 1 is a schematic diagram of hardware configuration of a system for automatically comparing test points of a PCB in accordance with a preferred embodiment of the present invention.

FIG. 1 is a schematic diagram of hardware configuration of a system for automatically comparing test points of a printed circuit board (PCB) (hereinafter, "the system") in accordance with a preferred embodiment of the present invention. Generally, a PCB includes a plurality of network traces each having a plurality of pads and an end point. The network traces are for carrying signals from one pad to other pads along trace paths. The pads are for PCB device mounting, as conductors to transfer signals from one layer of a PCB to other layers, or as interface conductors to other electronic devices. The end point is used for testing the PCB. All end points to be tested are called test points.

The system comprises an application server 1, a database 6 connected to the application server 1 through a connection 5, and a plurality of client computers 4 linked to the application server 1. The connection 5 is a database connectivity such as an Open Database Connectivity (ODBC) or a Java Database Connectivity (JDBC). The database 6 stores a plurality of PCB files. The PCB files may be design drawings of a PCB in different versions. The client computers 4 may be general-purpose computer devices such as personal computers, laptops and portable handheld devices, or mobile phones and other suitable electronic communication terminals. The application server 1 is used for comparing test points in a target file and a corresponding source file, and generating a comparison report. The target file is generally the newest version of design drawings of a PCB. The source file may be a former version of the target file.

Figure 2:
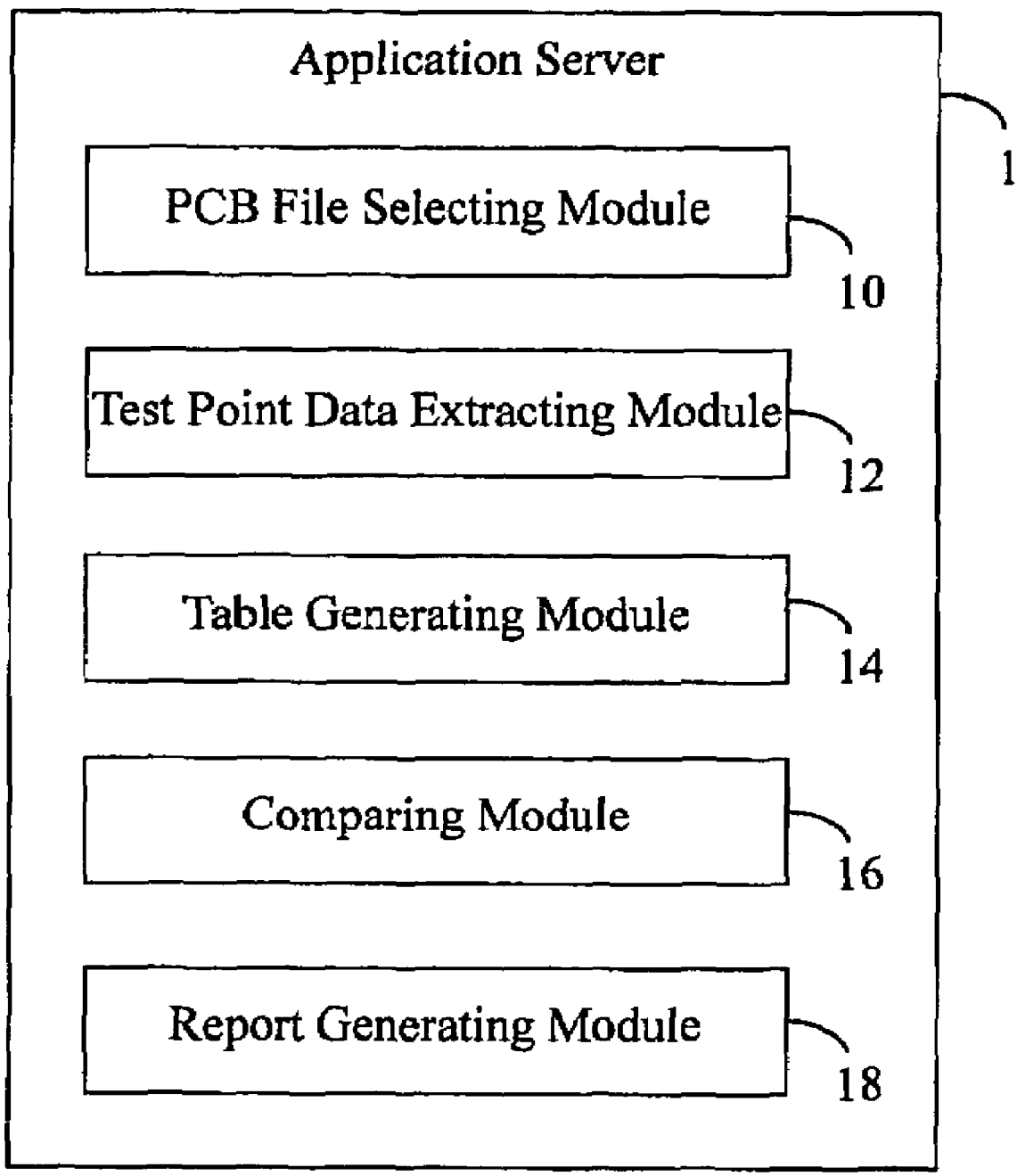
FIG. 2 is a schematic diagram showing function modules of the application server of FIG. 1.

FIG. 2 is a schematic diagram showing function modules of the application server 1. The application server 1 includes a PCB file selecting module 10, a test point data extracting module 12, a table generating module 14, a comparing module 16, and a report generating module 18. The PCB file selecting module 10 is for selecting a target file and a corresponding source file in which test points are to be compared. The test point data extracting module 12 is for extracting test point data from the target file and the source file. The test point data typically include network trace names, locations of the test points, status of the test points, pad names, pad types and layers where the test points are located. The table generating module 14 is for generating a target table according to the extracted test point data from the target file, and generating a source table according to the extracted test point data from the source file. The comparing module 16 is for comparing the test point data in the target table and the source table one by one to check whether each of the test points is modified, and storing comparison results on those test points which have been modified. The report generating module 18 is for generating a comparison report according to the comparison results of the test points.

Figure 3:
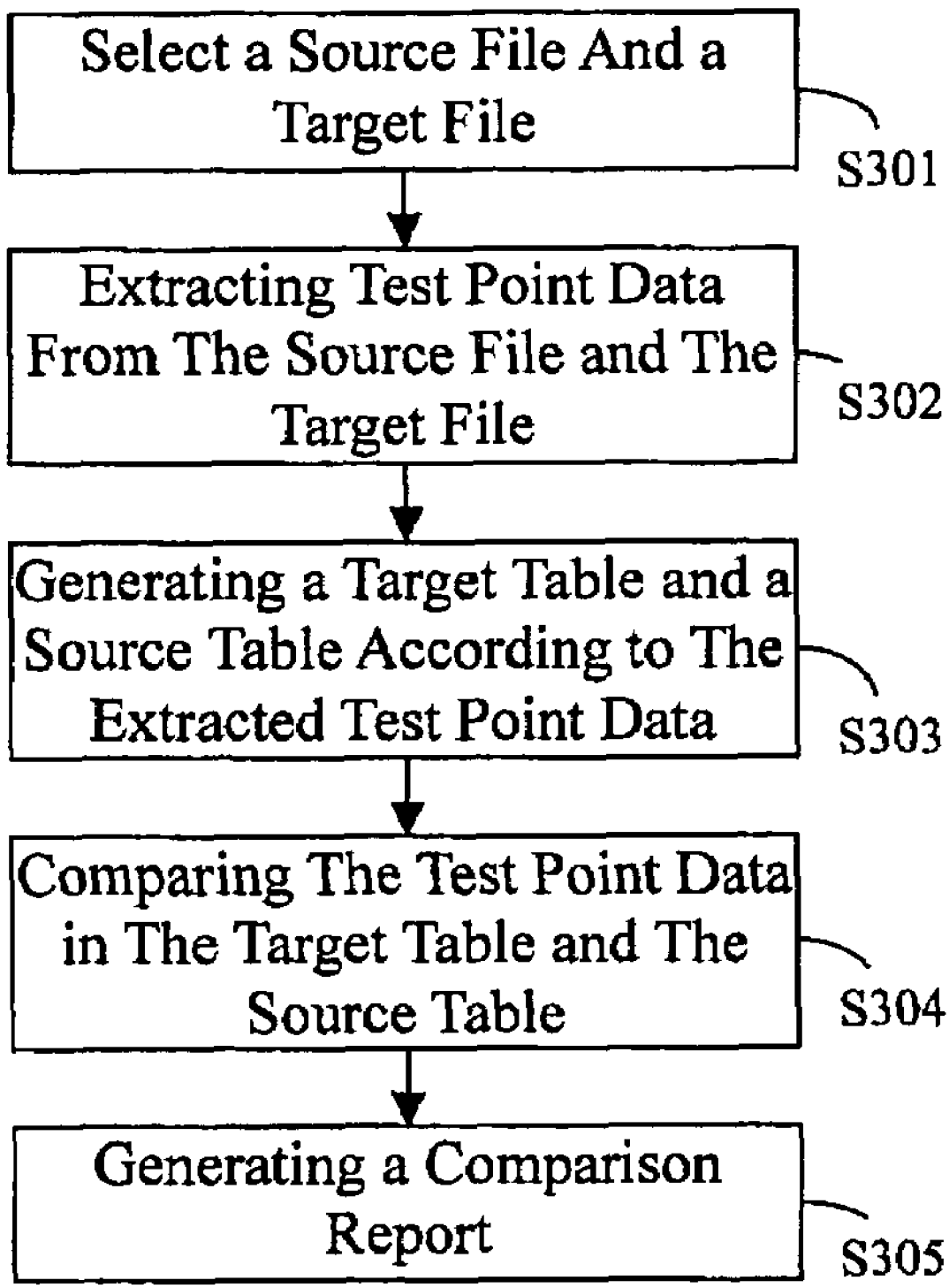
FIG. 3 is flowchart of a preferred method for automatically comparing test points of a PCB by utilizing the system of FIG. 1.

FIG. 3 is a flowchart of a preferred method for automatically comparing test points of a PCB by utilizing the system. In step S301, the PCB file selecting module 10 selects a target file and a corresponding source file in which the test points are to be compared from the database 6. In step S302, the test point data extracting module 12 extracts test point data from the target file and the source file respectively. In step S303, the table generating module 14 generates a target table and a source table respectively according to the extracted test point data from the target file and the source file. In step S304, the comparing module 16 compares the test point data in the target table with the test point data in the source table, and stores comparison results on those test points which have been modified. First, the comparing module 16 searches in the source table to determine if there is a network trace name of a test point which is identical with the network trace name of the first test point in the target table. If so, the comparing module 16 determines whether locations of the two test points are identical. If the locations of the test points are identical, the first test point is regarded as unmodified. If the locations of the test points are different, the status of the first test point in the target table is regarded as "shifted." Then, the comparing module 16 stores the two test point data. If there is no network trace name of a test point which is identical with the network trace name of the first test point in the target table, the first test point is regarded as "added," and the comparing module 16 stores the first test point data. Then, the comparing module 16 compares a next test point in the target table with the test points in the source table. After comparing all the test points in the target table with the test points in the source table, the comparing module 16 compares the test points in the source table with the test points in the target table one by one by repeating the above described steps, in order to check the status of each test point in the source table compared to the target table. In step S305, the report generating module 18 generates a comparison report according to the comparison results.

FIG. 4 is a schematic diagram showing details of a comparison report. The comparison report typically includes: SN, Network Trace Name, Status, TP Number, Location, Pad Name, Pad Type and TP Layer. SN is the serial number of a modified test point. Status shows how the test point has been modified, and can be any one of "added," "shifted," and "removed." TP number includes two numbers separated by "/", with the first one denoting a number of the test point in the target file and the second one denoting a number of the test point in the source file. Location lists the coordinates of the test point in the target file and/or in the source file. TP layer is the layer where the test point is located on the target file and the source file. For example, the network trace name of SN 1 is "+12V," with the status being "added," which means the test point SN 1 in the target file is new compared to the source file. Thus, TS number is 1/0. Location of the test point in the target file is (−100.0-8545.0).

Although the present invention has been specifically described on the basis of a preferred embodiment and preferred method, the invention is not to be construed as being limited thereto. Various changes or modifications may be made to the embodiment and method without departing from the scope and spirit of the invention.

We claim:

1. A computer-based method for automatically comparing test points of a printed circuit board (PCB), comprising the steps of:

selecting a target file and a corresponding source file from a database;

extracting test point data from the target file and the source file;

generating a target table according to the extracted test point data from the target file, and generating a source table according to the extracted test point data from the source file;

comparing the test point data in the target table and the source table one by one to check whether each of the test points is modified, and storing comparison results on those test points whose status has been modified; and generating a comparison report according to the comparison results of the test points.

2. The method according to claim 1, wherein the status of each modified test point is any one of "added," "shifted," and "removed."

3. A method for antomatically identifying test points of a printed circuit board (PCB), comprising the steps of:

selecting a target file to be identified and related to test points of a PCB;

selecting a source file of said test points corresponding to said target file;

extracting test point data of each identifiable test point out of said test points of said PCB from said target file and said source file respectively;

comparing said test point data of said each test point respectively from said target file and said source file so as to identify a current status of said each test point; and reporting said current status of said each rest point.

4. The method according to claim 3, further comprising the step of arranging said test point data from said target file into a target table and said test point data from said source file into a source table so as to facilitate data comparison in said comparing step.

5. The method according to claim 3, wherein said test point data comprises network trace names, locations of said test points, status of said test points, pad names, pad types and layers where said test points are located.

6. The method according to claim 3, wherein said target file is the newest version of a design drawing of said PCB.

* * * * *